United States Patent [19]

Mueller

[11] 4,422,044

[45] Dec. 20, 1983

[54] HIGH PRECISION TRIANGULAR WAVEFORM GENERATOR

[75] Inventor: Theodore R. Mueller, Oak Ridge, Tenn.

[73] Assignee: The United States of America as represented by the United States Department of Energy, Washington, D.C.

[21] Appl. No.: 322,145

[22] Filed: Nov. 17, 1981

[51] Int. Cl.$^3$ .......................... H03K 4/10; H03K 4/84
[52] U.S. Cl. .................................... 328/181; 328/185; 307/228
[58] Field of Search ................. 307/228, 491; 328/127, 328/128, 181, 185, 183, 184

[56] References Cited

U.S. PATENT DOCUMENTS

| 3,541,352 | 11/1970 | Merrill et al. | 328/183 |
| 3,676,698 | 7/1972 | Hunter | 328/183 |
| 3,828,203 | 8/1974 | Belson et al. | 307/228 |
| 3,893,036 | 7/1975 | Cavoretto et al. | 328/184 |

OTHER PUBLICATIONS

Versatile Triangular Sweep Generator by W. D. Wier et al., The Review of Scientific Instruments, vol. 35, No. 7, pp. 833-837, Jul. 1964.

Primary Examiner—Stanley D. Miller
Assistant Examiner—B. P. Davis
Attorney, Agent, or Firm—David E. Breeden; Stephen D. Hamel; Richard G. Besha

[57] ABSTRACT

An ultra-linear ramp generator having separately programmable ascending and descending ramp rates and voltages is provided. Two constant current sources provide the ramp through an integrator. Switching of the current at current source inputs rather than at the integrator input eliminates switching transients and contributes to the waveform precision. The triangular waveforms produced by the waveform generator are characterized by accurate reproduction and low drift over periods of several hours. The ascending and descending slopes are independently selectable.

4 Claims, 3 Drawing Figures

HIGH PRECISION TRIANGULAR WAVEFORM GENERATOR

BACKGROUND OF THE INVENTION

This invention relates generally to programmable signal generators and more particularly to precision signal generators for precise triangular waveform generation.

In various precision measurement applications such as a high resolution mass spectrometry application, a precision triangular generator is often needed. It is required that the waveform generator be stable for a period of several hours in order to acquire mass resolution data buried in the system noise.

In a digital approach to designing a triangular waveform generator, an oscillator drives a counter and the counter output goes to a digital-to-analog converter (DAC). The output from the DAC is a staircase ramp rather than a linear ramp. In many applications, as described above, it is desirable that the linearity of the ramp be very precise, thus eliminating the digital step approach of generating a ramp signal or signals for a triangular waveform.

Another approach to designing a triangular waveform generator is by analog means. In the conventional analog design, two constant current sources are used to generate the ascending and descending ramps. Due to the current sources being switched at their outputs, switching transient voltages are produced in the output waveform that would be intolerable in precision measurement applications. A second difficulty with the conventional analog approach is a need to design two constant current sources having such precision that a great deal of complexity and cost is involved. Some analog integrator designs use field effect transistors (FET) as switches. The characteristics of these devices limit the range of useable integrator time constants (ramp rates) where precision performance is required. Thus, there is a need for an instrument to provide a precise triangular waveform without the drawbacks of the digital waveform generator and the complexity and cost of available precision analog waveform generators.

SUMMARY OF THE INVENTION

It is therefore an object of this invention to provide a programmable triangular waveform generator having a high precision over long periods of time.

Another object of this invention is to provide a triangular waveform generator having negligible voltage transients when the ramp voltages are switched.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects in accordance with the purpose of the present invention, as embodied and broadly described herein, the triangular waveform generator of this invention may comprise a current generator which is driven by two constant current sources which are connected at all times to the input of the integrator but are switched at their inputs to prevent switching transients in the output of the integrator. Switching means are provided which are responsive to the output of the integrator and upper and lower limit reference voltages to alternately switch the current generator off and on to generate the ascending and descending ramps of the rectangular form. Both the voltage scale and the ramp rate of both the ascending and descending ramps may be selected separately.

BRIEF DESCRIPTION OF THE DRAWINGS

The accompanying drawings, which are incorporated in and form a part of the specification, and together with the description, serve to explain the principles of the invention.

In the drawings.

DETAILED DESCRIPTION OF THE INVENTION

Figure 1:
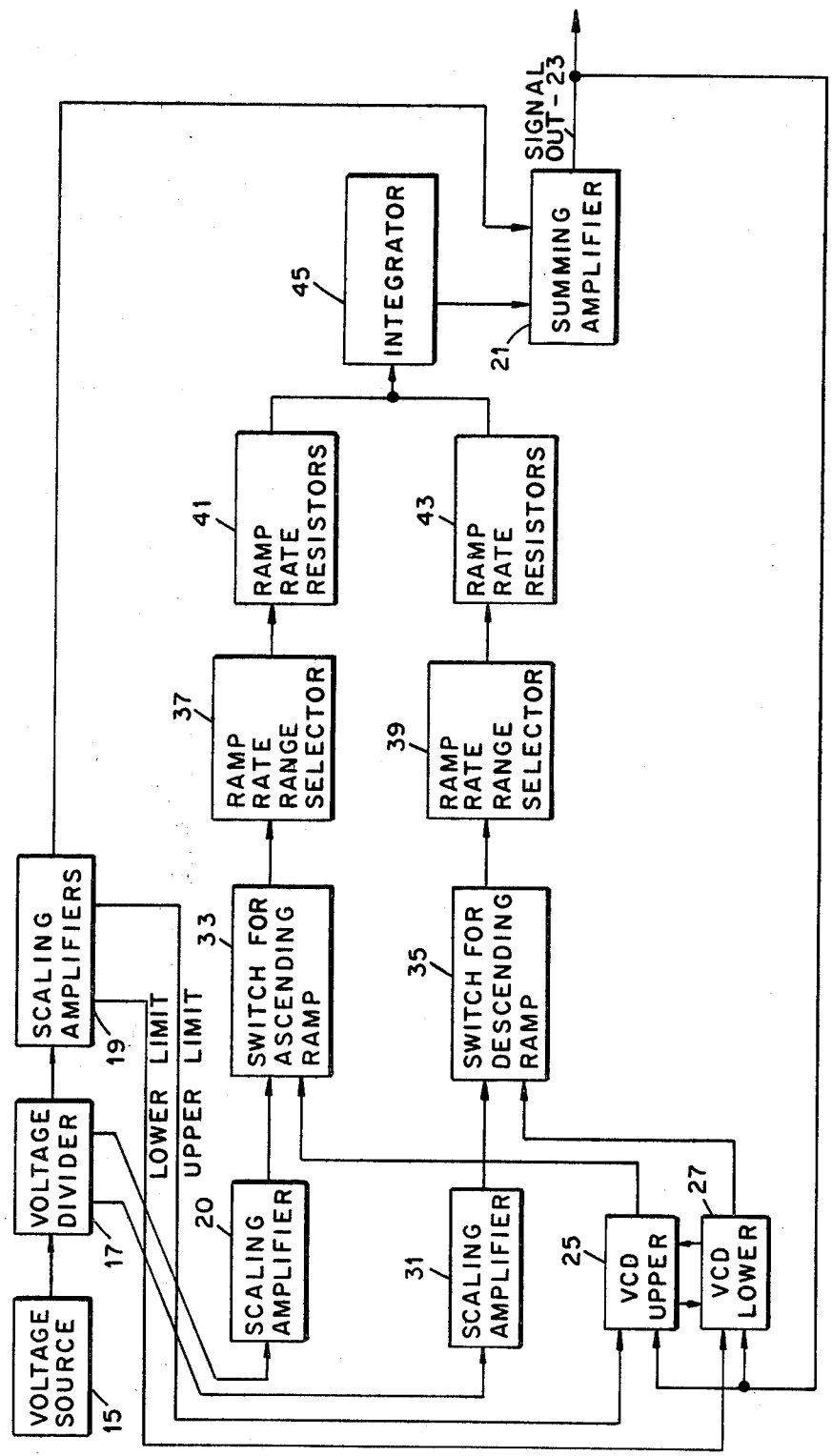
FIG. 1 is a schematic block diagram showing the subject triangular waveform generator.

Referring now to FIG. 1, a highly stabilized voltage source 15 is used to generate a voltage which serves as a reference voltage for the entire system. The reference voltage from the reference voltage source 15 is supplied to the input of a voltage divider 17 from which voltages may be selected for selecting initial conditions and reference voltages in various parts of the circuit.

One voltage signal from divider 17 is fed to a group of scaling amplifiers 19 which in turn provide voltages on three output leads. The first voltage from the scaling amplifier 19 is a selected positive or negative voltage that provides an initial condition or voltage reference level to a summing amplifier 21. The summing amplifier 21 provides the final triangular waveform output of the circuit on lead 23. The initial condition signal level and polarity of the output of the summing amplifier are separately selectable from the scaling amplifier 19 and applied to one input of the summing amplifier 21. This allows an operator to select a level other than zero from which the waveform may begin.

The other two reference voltages from the scaling amplifier 19 are selected voltage values for the upper and lower voltage limits for the rectangular waveform output. These voltages go to corresponding voltage crossing detectors 25 and 27 which switch their output polarities as a function of whether the signal on lead 23 is above or below the upper or lower scan limit threshold levels, respectively.

Referring again to the voltage divider 17, two additional voltage signals are provided to the inputs of two scaling amplifiers 20 and 31 respectively, which convert the input voltage signals into scaled voltages for two current generating circuits. These voltages are presented to two switches 33 and 35, respectively. Switch 33 enables the ascending ramp of the triangular waveform and switch 35 enables the descending ramp.

Figure 3:
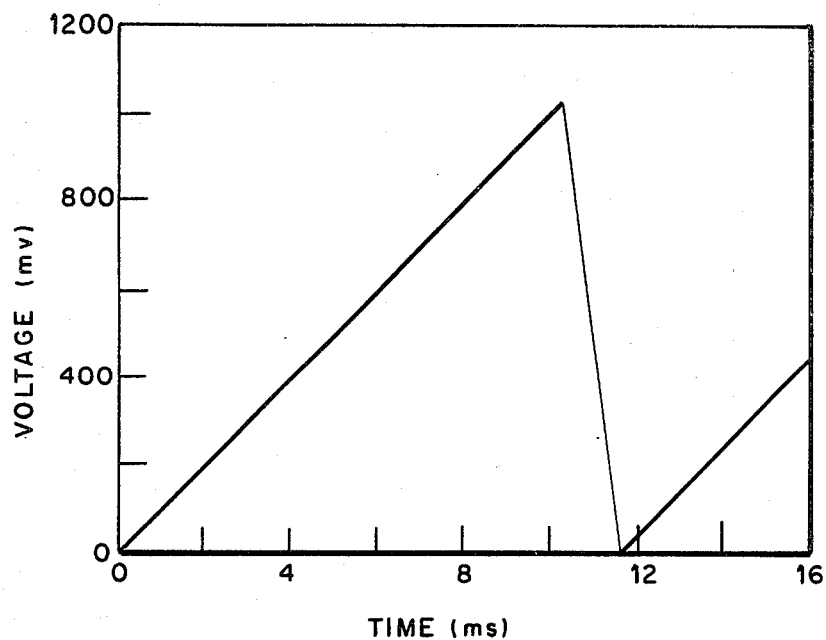
FIG. 3 is a graph of a typical waveform generated by the generator of FIG. 1 at a high signal repetition rate.

With regard to the generation of the ascending ramp, the voltage from switch 33 is provided to a sweep rate range selector 37 which allows an operator the selection of either a volts/second or a mv/second range of a positive-going ramp rate. The signal from the range selector 37 goes to a bank of resistors 41 to convert the voltage into a constant current source for the input to an integrator 45. Similarly, the descending ramp of the waveform is controlled by the switch 35 range selector 39 and the ramp rate resistors 43 connected to the same input of the integrator 45. The ramp rate resistor circuits 41 and 43 may comprise a bank of resistance values, as shown in FIG. 3, which are series selectable by separate switches for the upper and lower ramp rates which connect appropriate resistance values in series with the rate voltage signal from the range selectors 37 and 39, respectively. Since the input signal provided to the integrator 45 from the selected resistance value is very carefully controlled and since these resistors are large resistance values (1 K-1 M), the input to the integrator 45 appears to come from a constant current source.

The switches 33 and 35 are controlled by the separate outputs of the voltage crossing detectors (VCD's) 25 and 27, respectively. The respective voltage crossing detectors compare the upper and lower selected voltage limits with the output signal from the summing amplifier 21 and switch their outputs when the limits are exceeded. The VCD 25 compares the output of the summing amplifier 21 with the upper voltage limit selected and turns switch 33 "off" when the upper limited is reached. Likewise the VCD 27 compares the output of amplifier 21 with the lower limit value and turns switch 35 off when this value is exceeded. Each time VCD 25 is turned off it in turn triggers VCD 27 "on" and vice versa so that the switches 33 and 35 are never on at the same time.

This arrangement allows the input of the integrator to be continuously connected to the selected resistance value and to the voltage source thus preventing switching transients in the input of the integrator. When switch 33 is on and switch 35 is off, a positive voltage is applied to the ramp rate resistor bank 41 while zero voltage is applied to the bank 43. When switch 35 is on, a negative voltage is applied to the resistor bank 43 while zero voltage is applied to the resistor bank 41.

Significant to the invention is the fact that switches 33 and 35 should not be envisioned as devices for opening and closing a circuit. In the open or off condition, a conventional switch represents a high resistance and a possible source of noise. Rather, these switches are active electronic components which change the voltage applied to the series resistors 41 and 43 from a value significantly different from OV to OV, while maintaining physical continuity in the circuit. Another characteristic of these switches (33 and 35) is that they have output resistances in the milliohm region. Thus, any changes in their source resistance (gain or temperature related) will introduce uncertainties in the output signal in the order of only about 1-part-per-million. Still another feature of these switches deriving from their low output resistance is that an integrator with a very wide range of time constants can be realized, as has been accomplished in this precision ramp generator. Thus, this invention circumvents the restrictions imposed with FET switches; namely, drift from leakage current in the off condition and appreciable and variable resistance resulting in nonlinearity in the on condition.

Figure 2:
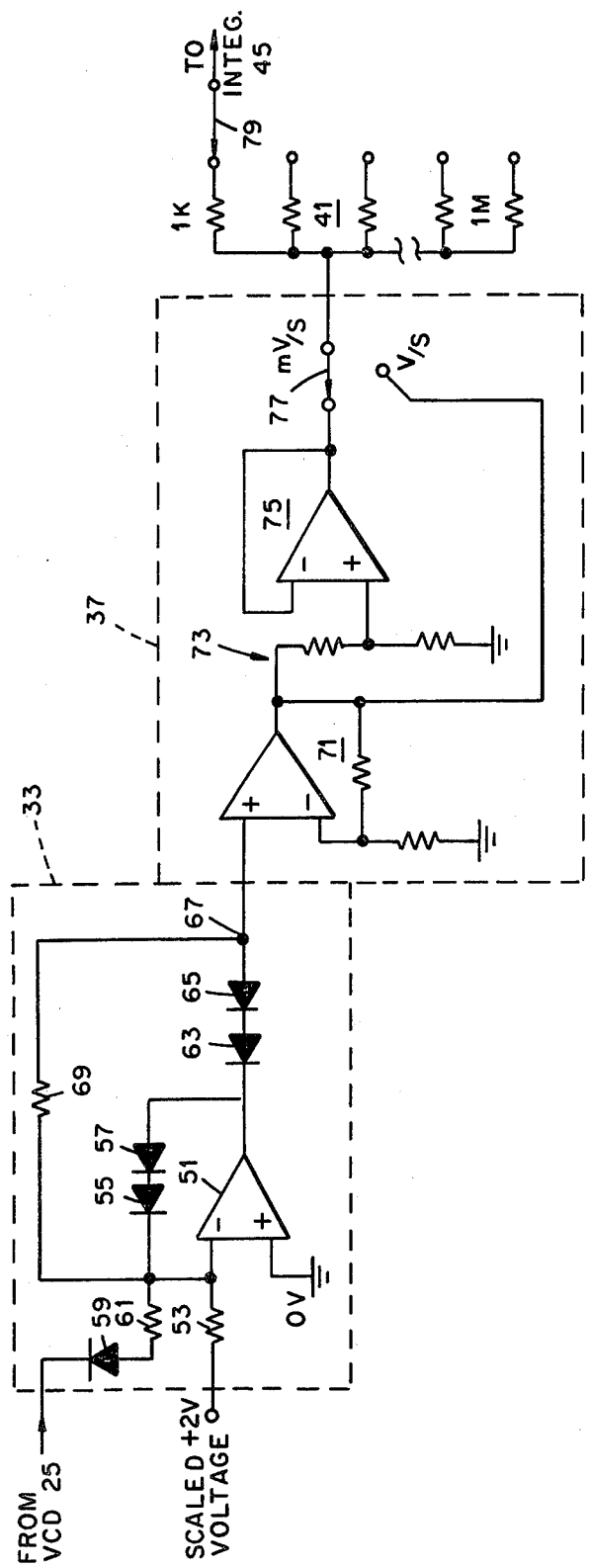
FIG. 2 is a schematic diagram of the switching, ramp rate range selector and ramp rate resistor circuit shown in block form in FIG. 1.

Referring now to FIG. 2, it will be seen that the switching (represented by a detailed schematic of switch 33) is accomplished by means of a modified gated rectifier switch whose output will have two precisely defined voltages, one of which is accurately and precisely zero volt. The switch is placed in a position in the circuit where the propagation of any switching transients to the output signal is minimal.

The switch 33 includes an operational amplifier 51 with its non-inverting input (reference input) connected to OV, or ground potential. The inverting input is connected to receive the scaled voltage output (+2 V) from the scaling amplifier 20 (FIG. 1) through a resistor 53. A pair of series diodes 55 and 57 is connected between the inverting input and the output of amplifier 51 with the cathodes toward the input thereof. The switching, or gate control, output of VCD 25 is connected through a diode 59 and a resistor 61 to the inverting input of amplifier 51 such that the anode of diode 59 is toward the input of amplifier 51. The output of amplifier 51 is connected through a pair of series-connected diodes 63 and 65 (cathodes towards the output of amplifier 51) to an output terminal 67. The output terminal 67 is connected to the inverting input of amplifier 51 through a resistor 69. Series-connected diodes are used in the feedback loops of amplifier 51 to increase the leakage resistance and decrease the capacitance compared to that of a single diode.

The output terminal 67 of the switch 33 is connected to the input of an amplifier 71 in the ramp rate range selector 37. The output is connected through a 1:1000 voltage divider 73 to the input of a voltage follower 75. A selector switch 77 is provided with one terminal connected to the output of amplifier 71 and a second terminal connected to the output of the voltage follower 75. The selector terminal of switch 77 is connected to the common connection of the resistor bank 41. The series-resistance value is selected by means of a selector switch 79 which has its selector terminal connected to the input of the integrator 45 (FIG. 1).

Referring back to the gated rectifier circuit 33 (FIG. 2), it will be seen that since the amplifier 51 reference voltage is OV, the amplifier output and terminal 67 output will be OV when the gate is "closed", diode 59 forward biased. When the gate is "open", i.e., the output of VCD 25 exceeds +2 V, the output of amplifier 51 will be $-E_{in}$ plus the voltage developed across the conducting diodes. Since amplifier 51 has an input voltage of +2 V, its output will be slightly over 3 V. However, since +2 V at the input from the scaling amplifier generates a current of 0.04 mA, assuming resistors 53 is 50 K ohms, which also flows through the feedback resistor 69 (50 K ohms), the circuit output voltage at terminal 67 will be $-2$ V. The magnitude of the $-2$ V signal will be the same as that of the +2 V input signal if resistors 53 and 69 are perfectly matched 50 K ohm resistors. Since the accuracy of this signal depends on having all of the input current flow in the feedback resistor 69, it is necessary that the amplifier 71 of the circuit 37 be a high impedance input amplifier to transform this voltage into a low impedance source from which current can be drawn. Amplifier 71 is operated with a gain of 4 so that the output changes from 0 V to $-8$ V and vice versa when switched. Due to the 1:1000 voltage divider 73, the output of amplifier 73 will change from 0 V to $-8$ mV. Thus, the operator may select by means of switch 77 either a volt or millivolt ramp rate range.

It will be understood that the circuitry for components 35, 39 and 43 (FIG. 1) is identical to that shown in FIG. 2, except that the diodes are reversed to produce 0 V and +8 V (8 mV).

In operation, a ramp voltage on the output lead 23 increases towards its upper limit until it finally approaches and exceeds that limit by a very small amount. When the limit is exceeded, the voltage crossing detector 25 switches switch 33 off, and in so doing switches off current source 41 and turns on the other one through the switch 35 turning the VCD 27 on. The ramp then descends at the selected rate according to the resistance values selected in the resistance bank 43 and the integrator 45 output now moves in the opposite direction toward its lower limit value, whereupon the voltage crossing detector 27 switches switch 35 off and switch 33 on and the waveform is continuously produced in a repeated manner.

Referring now to FIG. 3, there is shown a graph of a triangular voltage waveform produced by the subject circuit. In the graph, the vertical sensitivity is 200 mV per division, and the horizontal sensitivity is 2 milliseconds per division. Thus, the graph depicts a 10 millisecond sweep with a zero volt for the lower limit and one volt for the upper. The ascending ramp rises at a rate of 100 volts/second and the descending ramp rate is much faster at 800 volts/second. This depicts the manner in which the ascending ramp and descending ramp may be separately selectable.

It will be obvious from the above that a triangular waveform generator has been provided which will reproduce repeatedly a rectangular voltage waveform having programmable upper and lower limits and separately programmable ascending and descending ramp rates. A triangular waveform generator would be useful as a voltage source for any device requiring linear ramp voltages as a function of time. This may include instruments requiring linear, angular displacements. It may also be useful with appropriate matching circuitry to program voltage and current power supplies. Other applications may exist anywhere repeatable voltage waveforms need to be supplied as in statistical averaging of signal values from noise.

The foregoing description of the preferred embodiment of the invention has been presented for purposes of illustration and description. It is not intended to be exhaustive or to limit the invention to the precise form disclosed, and obviously many modifications and variations are possible in light of the above teachings. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A triangular waveform generator, comprising:
   a current integrator having an input and an output;
   a first constant-current-generating means connected to the input of said integrator for generating and applying a first constant current to said input of said integrator corresponding to a selectable positive-going ramp rate for the triangular waveform at the output of said integrator in response to a first selectable scaled voltage applied to an input thereof,
   a second constant-current-generating means connected to the input of said integrator for generating and applying a second constant current following said first constant current to said input of said integrator corresponding to a selectable negative-going ramp rate for said triangular waveform at the output of said integrator in response to a second scaled voltage applied to said input;
   means for generating said first and second selectable scaled voltages;
   means for generating first and second selectable reference voltages corresponding to the desired upper and lower voltage limits, respectively, of said triangular waveform; and
   switching means for alternately applying said first and second scaled voltages to said first and second constant-current-generating means, respectively, including first and second gated rectifier circuits each having an input connected to receive said first and second scaled voltages, respectively, and generating and continuously applying either a zero volt signal or the corresponding scaled voltage signal to said first and second current generating means, respectively, when gated "off" or "on" in response to first and second gate control signals applied to respective gate control inputs thereof; and first and second voltage crossing detector means each having inputs coupled to receive the output signal of said integrator and said first and second reference voltages, respectively, for generating said first and second gate control signals so that said first gated rectifier circuit is gated on and said second gated rectifier circuit is gated off until the amplitude of the positive going portion of the output signal of said integrator crosses said first reference signal level and alternately said first gated rectifier circuit is gated off and said second gated rectifier circuit is gated on until the amplitude of the negative-going portion of the output signal of said integrator crosses said second reference signal level.

2. The waveform generator as set forth in claim 1, further comprising means for selectably controlling the ramp rate voltage range of the output of said integrator.

3. The waveform generator as set forth in claim 2, wherein each of said first and second constant current generating means includes a plurality of series-selectable resistors.

4. The waveform generator as set forth in claim 3 further including a summing amplifier having first and second voltage summing inputs connected in series with the output of said integrator at said first summing input and means for generating and applying a selectable, stable initial reference voltage level to said second input of said summing amplifier so that the initial reference voltage level of said triangular waveform at the output of said summing amplifier may be varied.

* * * * *